(12) United States Patent
Gray et al.

(10) Patent No.: US 7,009,484 B2
(45) Date of Patent: Mar. 7, 2006

(54) MAGNETIC ASSEMBLY

(75) Inventors: Michael Gray, Castlemartyr (IE);
Edward Bradley, Midleton (IE)

(73) Assignee: Artesyn Technologies, Inc., Boca Raton, FL (US)

( * ) Notice: Subject to any disclaimer, the term of this patent is extended or adjusted under 35 U.S.C. 154(b) by 133 days.

(21) Appl. No.: 10/736,311

(22) Filed: Dec. 15, 2003

(65) Prior Publication Data

US 2005/0128040 A1    Jun. 16, 2005

(51) Int. Cl.
*H01F 27/29* (2006.01)
(52) U.S. Cl. .................................................. 336/192
(58) Field of Classification Search ................. 336/65, 336/83, 192, 198, 200, 232
See application file for complete search history.

(56) References Cited

U.S. PATENT DOCUMENTS

| | | | | |
|---|---|---|---|---|
| 3,585,553 | A | * | 6/1971 | Muckelroy et al. ......... 336/192 |
| 4,455,545 | A | * | 6/1984 | Shelly ......................... 336/200 |
| 5,233,318 | A | * | 8/1993 | Sasaki et al. ................ 333/109 |
| 5,351,167 | A | | 9/1994 | Wai et al. |
| 5,572,180 | A | | 11/1996 | Huang et al. |
| 5,696,477 | A | * | 12/1997 | Yamamori et al. .......... 336/192 |
| 6,094,123 | A | | 7/2000 | Roy |
| 6,392,524 | B1 | * | 5/2002 | Biegelsen et al. .......... 336/200 |
| 6,504,463 | B1 | * | 1/2003 | Kato et al. .................... 336/83 |
| 6,570,478 | B1 | | 5/2003 | Meeks |

FOREIGN PATENT DOCUMENTS

JP          03-104203     *  5/1991

OTHER PUBLICATIONS

LG Cable, "Compounds-Lead Frame", web pages accessed Nov. 14, 2003, http://www.lgcable4u.com/product/product_rod.asp?cateno=12.

Magnetics, "Ferrite Cores", web pages accessed Nov. 12, 2003, http://www.mag-inc.com/ferrites/ferrites.asp.
Magnetics, "Ferrite Power Transformation and Filtering Shapes", web pages accessed Nov. 12, 2003, http://www.mag-inc.com/ferrites/ferrite_power_shapes.asp.
Magnetics, "Ferrite Pot Cores", web pages accessed Nov. 12, 2003, http://www.mag-inc.com/ferrites/ferrite_pot_cores.asp.
Magnetics, "Ferrite DS, RS Cores", web pages accessed Nov. 12, 2003, http://www.mag-inc.com/ferrites/ferrite_ds_rs_cores.asp.
Magnetics, Ferrite RM (square) Cores, web pages accessed Nov. 12, 2003, http://www.mag-inc.com/ferrites/ferrite_rm_cores.asp.
Magnetics, "Ferrite E, I and U Cores", web pages accessed Nov. 12, 2003, http://www.mag-inc.com/ferrites/ferrite_e_l_u_cores.asp.
Magnetics, "Ferrite EC, ER, ETD and EER Cores", accessed Nov. 12, 2003, http://www.mag-inc.com/ferrites/ferrite_ec_cores.asp.
Magnetics, "Ferrite EP Cores", accessed Nov. 12, 2003, http://www.mag-inc.com/ferrites/ferrite_ep_cores.asp.
Magnetics, "Ferrite PQ Cores", accessed Nov. 12, 2003, http://www.mag-inc.com/ferrites/ferrite_pq_cores.asp.

* cited by examiner

*Primary Examiner*—Tuyen T Nguyen
(74) *Attorney, Agent, or Firm*—Kirkpatrick & Lockhart Nicholson Graham LLP

(57) ABSTRACT

A magnetic assembly for mounting to a circuit includes a winding and a core. The winding has a first end, a second end and a wound portion. Further, the core is disposed around at least a portion of the winding. The first end of the winding extends outward from the wound portion to define a linear support and the second end of the winding extends outward from the wound portion on an opposite side of the wound portion to define a point support. As such, the first and second ends of the winding are adapted to mount to the circuit.

14 Claims, 4 Drawing Sheets

MAGNETIC ASSEMBLY

BACKGROUND OF THE INVENTION

The present invention is directed generally to a magnetic assembly and, more particularly, to a magnetic assembly for mounting to a circuit having lead ends supporting the assembly.

Magnetic assemblies are employed to perform a wide range of functions in various electronic devices. Such functions may include, but are not limited to, using the assembly as an inductor, for energy storage, as a choke coil, as an inverter, as transformers to change voltage level, as well as various other functions known in the art. Magnetic assemblies thus often include a magnetic core made of a ferrite material that is wound with a conductive coil and positioned on top of or below a circuit board.

Because of the desire to miniaturize electronic components, it is often desirous to maximize the current density and/or power density of such magnetic assemblies. To achieve a high current density and/or power density, conventional assemblies are typically wound with as much wire as possible in as small a space as possible. Despite such techniques, magnetic assemblies often consume a substantial amount of surface area on a circuit board and height above the circuit board, especially in comparison with other circuit components. Thus, while transistors, diodes, capacitors and resistors have been miniaturized to microscopic levels, magnetic assemblies generally remain bulky as they have been traditionally mounted either horizontally or vertically on circuit boards with as much wire wound on the core as possible.

Size limitations of conventional inductors are most apparent in power circuit applications such as AC-DC and DC-DC power converters. These power converters are generally bulky due to the spacious footprint required, high profile and high thermal resistances of the magnetic assemblies. Furthermore, inductors are challenged in that they have a limited ability to transfer heat from the core and windings to the device case or heat sink. This further reduces the amount of surface area available for other circuit components as a large surface area is required of the core for an efficient dissipation of heat. Tradeoff between coil wire size and core surface area is required for effective heat dissipation.

Thus, there exists a need for an improved magnetic assembly that overcomes the limitations, shortcomings, and disadvantages of the prior art.

SUMMARY OF THE INVENTION

In one general aspect, the present invention is directed generally to a magnetic assembly for mounting to a circuit. The magnetic assembly, according to one embodiment, includes a winding and a core disposed around at least a portion of the winding. The winding includes a first end, a second end and a wound portion. The first end of the winding extends outward from the wound portion to define a linear support while the second end of the winding extends outward from an opposite side of the wound portion to define a point support. The first and second ends of the winding are adapted to mount to the circuit.

Such a magnetic assembly may be disposed in a mounting aperture in a circuit board with the first and second ends providing support for the assembly on the circuit board. The circuit board may have an upper surface, a lower surface and the mounting aperture through the circuit board. By disposing the magnetic assembly in the mounting aperture, the profile of the device may be reduced. Further, the first and second ends of the winding may define a plane that is coplanar with the circuit board to thereby provide the advantage of co-planarity.

In another general respect, the present invention is directed to a magnetic device. According to one embodiment, the magnetic device includes a circuit board and the above-described magnetic assembly mounted to the circuit board. The magnetic assembly may be disposed in a mounting aperture of the board such that the first and second ends of the winding support the magnetic assembly on the board and such that the center of gravity of the magnetic assembly is below the upper surface of the circuit board.

BRIEF DESCRIPTION OF THE DRAWINGS

Embodiments of the present invention will be described by way of example in conjunction with the following figures, wherein.

DETAILED DESCRIPTION OF THE INVENTION

Figure 1:
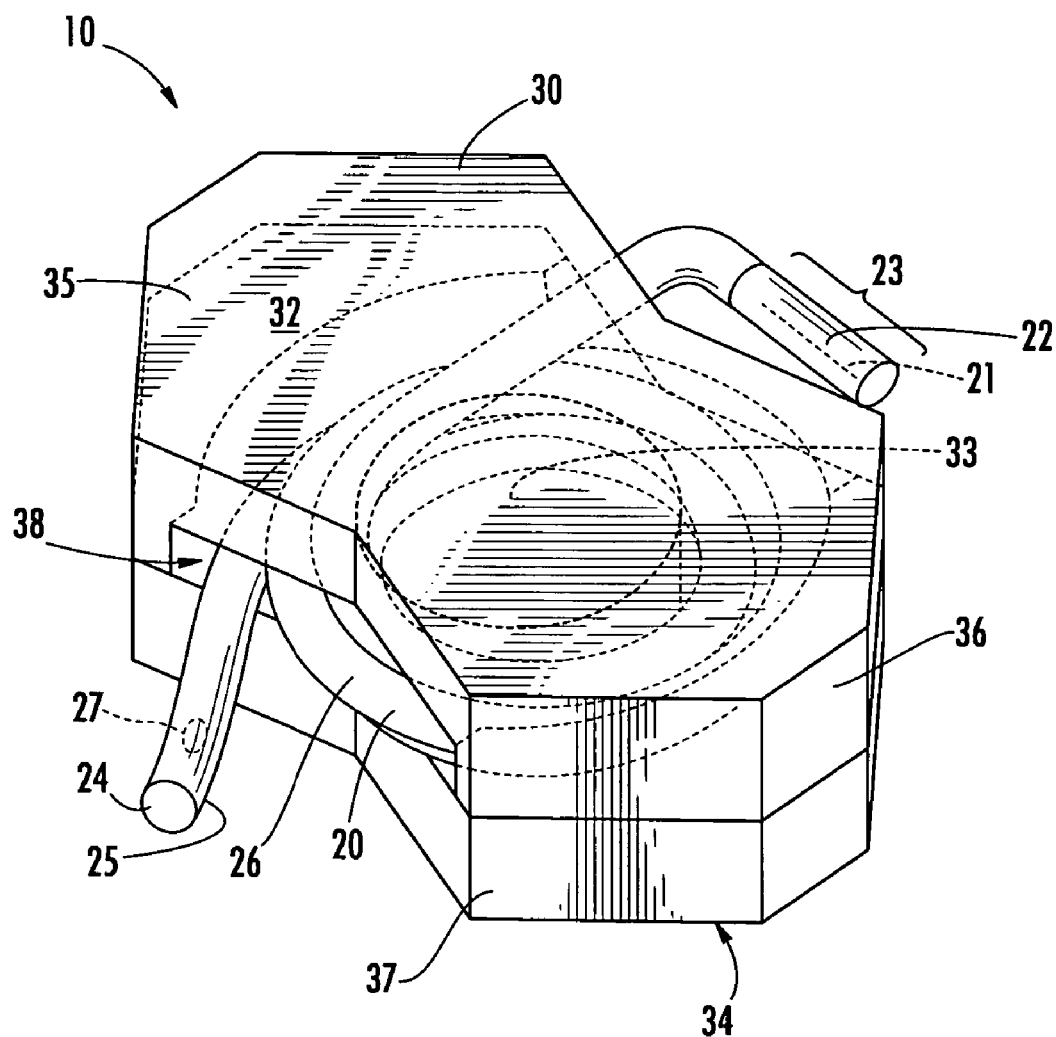
FIG. 1 illustrates a perspective view of a magnetic assembly according to one embodiment of the present invention.

FIG. 1 is a perspective view of a magnetic assembly 10 according to one embodiment of the present invention. The magnetic assembly 10 may include a winding 20 and a core 30 that may be disposed around at least a portion of the winding 20. The winding 20 may be round wire having a first end 22, a second end 24 and a wound portion 26. Other configurations of the wire may be used including, but not limited to, rectangular wire, etc. A central portion 33 of the core 30 may be disposed within the wound portion 26.

Figure 2:
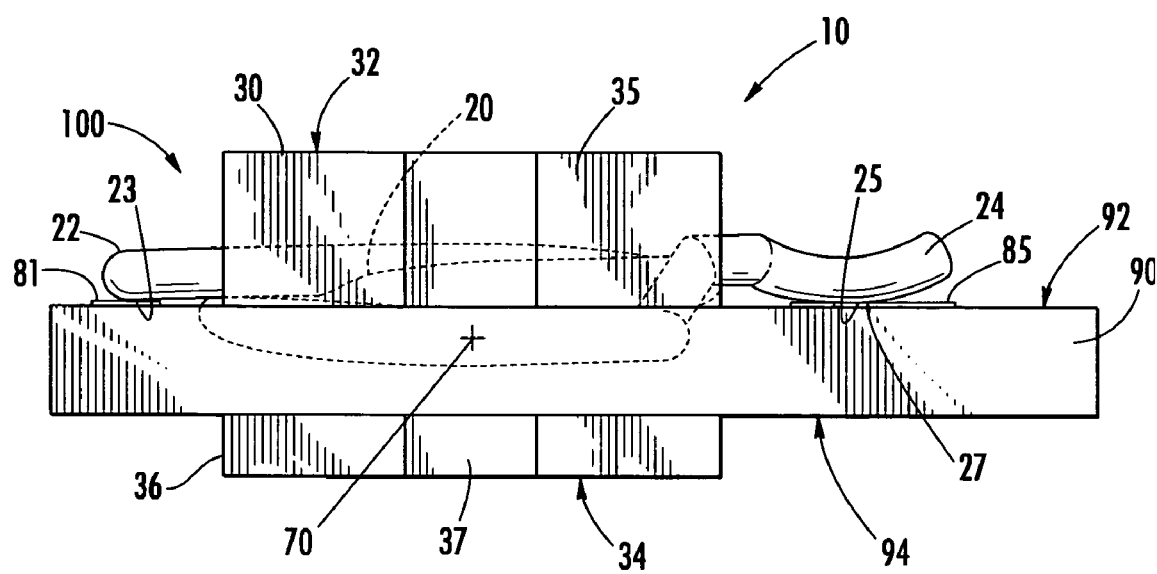
FIG. 2 illustrates a side view of the magnetic assembly according to one embodiment of the present invention.
Figure 3:
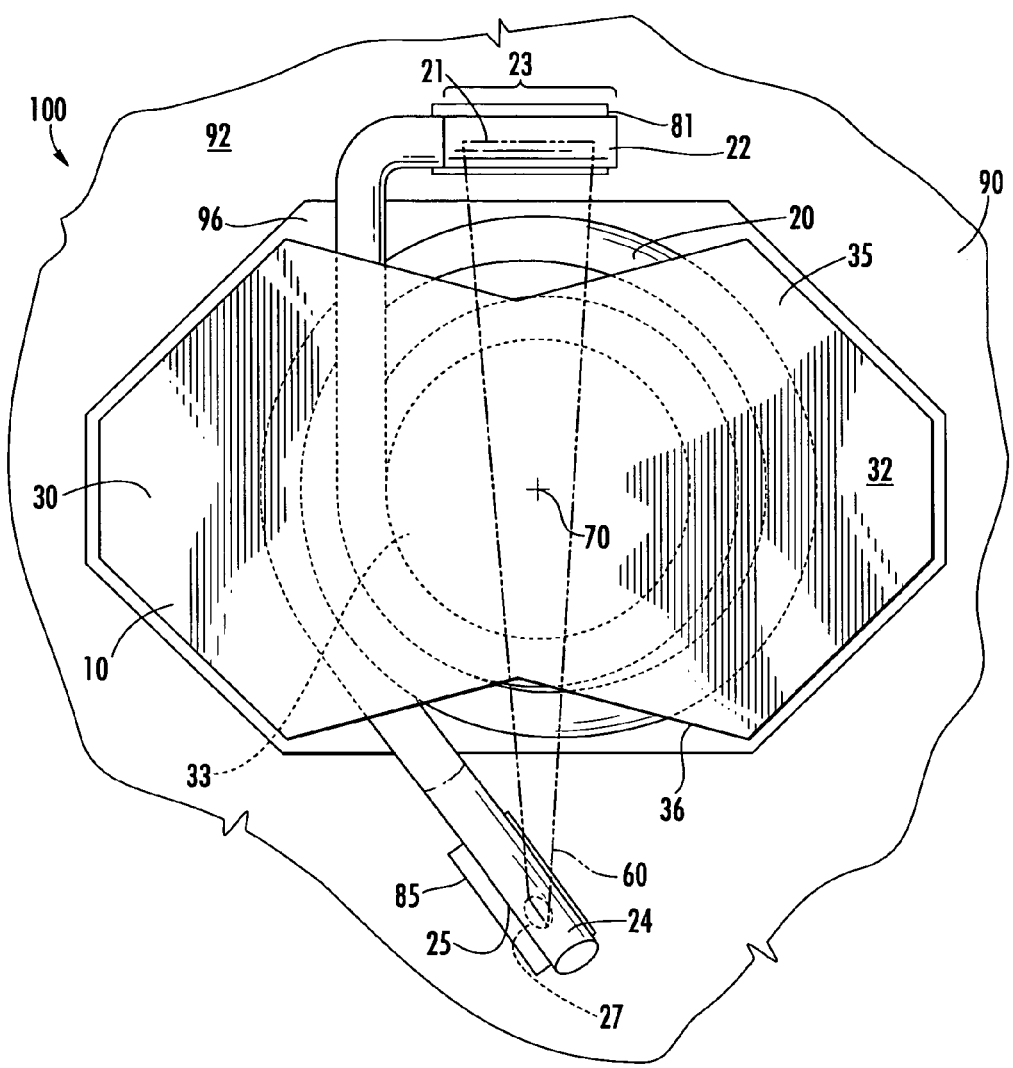
FIG. 3 illustrates a top view of the magnetic assembly according to one embodiment of the present invention.

FIGS. 2 and 3 show a device 100 including the magnetic assembly 10 and a circuit board 90. In various embodiments, the first end 22 of the winding 20 may be adapted to mount to the circuit board 90 along a line 21 as shown in FIGS. 2 and 3. The first end 22 may extend outward from the wound portion 26 and along the line 21 to define a linear support 23. The line 21 may be defined by two or more points of contact with the circuit board 90 along the length of the linear support 23. Thus, the linear support 23 may connect to the circuit board 90 along the line 21. As can be seen in FIG. 2, the magnetic assembly 10 may be disposed through the circuit board 90, as described further below, with the linear and point supports 23, 25 supporting the assembly on the circuit board 90.

Likewise, the second end 24 of the winding 20 may be adapted to mount to the circuit board 90 at a contacting point 27. The second end 24 may extend outward from the wound portion 26 on an opposite side of the wound portion 26 from the first end 22 and may have a convex curvature that defines a point support 25. The point support 25 may be adapted to mount to the circuit board 90. The point support 25 and the linear support 23 may define a plane that is coplanar with circuit board 90 as the contacting point 27 and line 21 may be positioned on solder pads 85, 81, respectively, of the circuit board 90. Thus, the point support 25 may connect to the circuit board 90 at the contacting point 27. Alternatively, the second end 24 could be a second linear support (not shown) much like linear support 23.

In various implementations, the linear support 23 and point support 25 connect to the circuit board 90 with solder (not shown). As well, the linear support 23 may contact and connect to the circuit board 90 at the solder pad 81 while the point support 25 may contact and connect to the circuit board 90 at the solder pad 85. These solder pads 81, 85 may be positioned on the circuit board 90 such that they are able to receive and contact the first and second ends 22, 24 at the linear support 23 and the point support 25, respectively. Due to the nature of the contacting point 27 engaging the solder pad 85, a high quality solder joint may be obtained as a more concentrated density of the solder is possible at the solder joint. Such a high quality solder joint may further produce a higher yield when compared with other configurations. Various methods of soldering known in the art may be used such as, for example, wave soldering, reflow soldering, hand soldering, etc. Further, due to the nature of the geometry of the contacting point 27 and linear support 23, manufacture of the magnetic assembly 10 may produce higher yields when compared with other configurations.

The core 30 may have a first portion 35, having an upper surface 32, attached to a second portion 37 having a lower surface 34. The first and second potions 35, 37 may be attached to one another in various manners such as, for example, using adhesives, etc. As shown in the drawings, the core 30 may be an RM-shaped ferrite core separated into two portions attached to one another. However, other cores may be used in the construction of the magnetic assembly 10 including, but not limited to, E cores, P cores, PQ cores, DS cores, etc. Alternatively, a single body core may be utilized.

As can be seen in the drawings, the upper surface 32 of the first portion 35 may be substantially flat such that a surface mounting apparatus, such as a surface mount pick and place machine, would be able to pick up and mount the magnetic apparatus 10 to the circuit board 90. Thus, the substantially flat upper surface 32 may provide the surface mount pick and place machine with a surface in which to engage the magnetic assembly 10. The lower surface 34, opposite the upper surface 32, of the second portion 37 may also be substantially flat for similar reasons to those presented above for the upper surface 32.

In various embodiments, the circuit board 90 has a mounting aperture 96 through the circuit board 90 between an upper surface 92 and a lower surface 94. As used herein, a "circuit board" may be any substrate upon which is formed a circuit, such as conductive traces and/or paths, for supporting and interconnecting one or more electronic components. For example, the circuit board 90 may be a printed circuit board or a lead frame. By positioning the magnetic assembly 10 through the mounting aperture 96, the surface area heat sink properties are maintained while clearance required for the magnetic assembly 10 is decreased, thus reducing the profile of the device 100.

FIGS. 1–3 illustrate the core 30 having outer side edges 36 between the upper surface 32 and the lower surface 34. The geometry of mounting aperture 96 may match the geometry of the outer side edges 36 as shown in FIG. 3, or at least a portion thereof, such that the edges of the circuit board 90 and the assembly 10 are in close proximity to one another while according to various embodiments, not abutting. Although the outer side edges 36 may not be configured to abut with the mounting aperture 96, it should be noted that variation in mounting procedures and manufacturing processes may allow for some contact between the mounting aperture 96 and the outer side edges 36. As shown, the outer side edges 36 may be sufficiently close to the mounting aperture 96 such that deleterious twisting of the core 30 will not occur. Although varying configurations of cores 30 may be employed within the spirit and scope of the invention, core configurations having corners about the outer side edges 36 may assist in prevention of such twisting.

Figure 4:
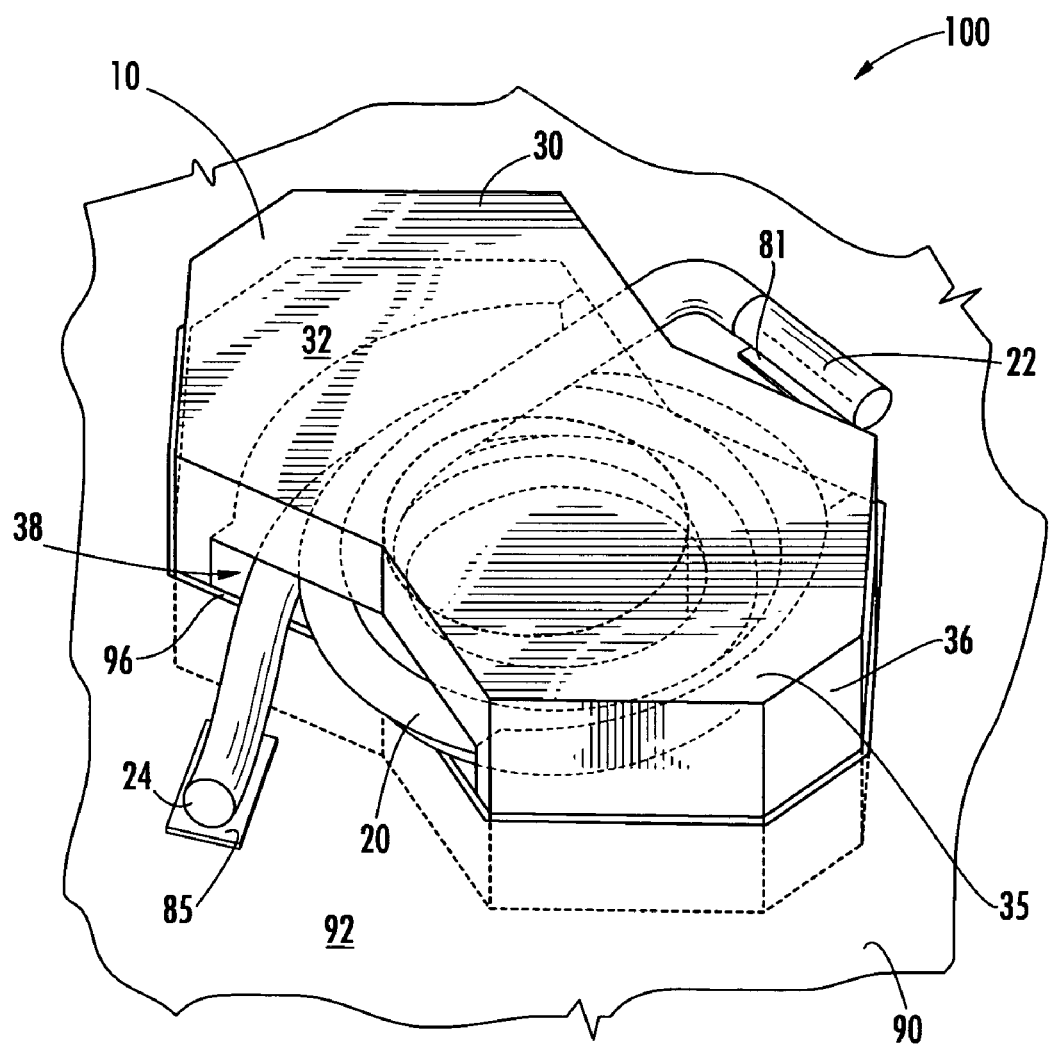
FIG. 4 illustrates a perspective view of the magnetic assembly according to one embodiment of the present invention.

The core 30 may further have side apertures 38 as shown in FIGS. 1 and 4. The side apertures 38 may define gaps on opposite sides of the wound portion 26 where the first and second ends 22, 24 extend therethrough. As shown, the side apertures 38 of the core 30 may be located along the outer side edges 36 such that the linear support 23 and the point support 25 may extend outward from the wound portion 26 to contact their respective solder pads 81, 85. The side apertures 38 may also be formed from the original shape of the abutting first and second portions 35, 37.

As can be seen in FIGS. 2 and 3, the linear support 23 and the point support 25 may have contacting points 21, 27 with the solder pads 81, 85. A bounded geometry 60 may be defined by the area circumscribed by the contacting points 21, 27, as shown in FIG. 3. The bounded geometry 60 may also be spatially coplanar with the circuit board 90 so as to provide the advantage of co-planarity, which is an important feature when soldering electrical components to circuit boards.

In addition, the centroid 70 (i.e. center of mass) for the magnetic assembly 10 may be within the bounded geometry 60 when viewing the magnetic assembly 10 as provided in FIG. 3. However, as shown in FIG. 2, the centroid 70 is positioned below the upper surface 92 of the circuit board 90. Thus, the centroid 70 may be located within orthogonal projections of the bounded geometry 60. Such a configuration provides a mechanically stable position of the magnetic assembly 10, as the centroid 70, or center of mass, is also below the first and second ends 22, 24. That is, the position of the centroid 70 acts by gravity to pull the magnetic assembly 10 into a sitting position onto the upper surface 92 of the circuit board 90.

To assemble and the device 100, the winding 20 may be positioned around the central portion 33 of the first portion 35 of the core 30. The winding 20 may be positioned such that the first and second ends 22, 24 extend outward from the wound portion 26 through the side apertures 38. The second portion 37 of the core 30 may then be affixed to the first portion 35. The magnetic assembly 10 may then be engaged by a surface mounting apparatus (not shown) for positioning the magnetic assembly 10 within the mounting aperture 96 of the circuit board 90. The surface mounting apparatus may then place the magnetic assembly 10 on the circuit board 90 such that the linear support 23 contacts the solder pad 81 while at the same time the point support 25 contacts the solder pad 85. The linear and point supports 23, 25 are then soldered to the circuit board 90 on the solder pads 81, 85 such that the outer side edges 36 are in close proximity to the mounting aperture 96 without touching the same. Thus, the magnetic assembly 10 will be mounted to the circuit board 90.

Although the present invention has been described and illustrated in detail herein with respect to certain embodiments, it is clearly understood that the same is by way of example and is not to be taken by way of limitation. It will be appreciated by those of ordinary skill in the art that numerous modifications and variations of the present invention may be implemented without departing from the spirit and scope of the present invention as described in the appended claims.

What is claimed is:

1. A magnetic device, comprising:
a circuit board having an upper surface, a lower surface and a mounting aperture therethrough between the first and lower surfaces;
a magnetic assembly positioned through the mounting aperture and mounted to the circuit board, wherein the magnetic assembly includes;
a winding having a first end, a second end and a wound portion; and
a core disposed around at least a portion of the winding, wherein:
the first end of the winding extends outward from the wound portion to define a linear support;
the second end of the winding extends outward from an opposite side of the wound portion to define a point support; and
wherein the linear support and the point support of the first and second ends mount onto the circuit board and support the assembly.

2. The magnetic device of claim 1, wherein the linear support mounts to the circuit board along a line defined by at least two contacting points, and wherein the point support mounts to the circuit board on at least one contacting point.

3. The magnetic device of claim 1, wherein the contacting points define a bounded geometry and wherein the centroid of the assembly is located within orthogonal projections of the bounded geometry.

4. The magnetic device of claim 1, wherein the centroid of the assembly is located below the upper surface of the circuit board.

5. The magnetic device of claim 1, wherein the second end of the winding has a convex curvature defining the point support.

6. The magnetic device of claim 1, wherein the first end of the winding has a linear portion defining the linear support.

7. The magnetic device of claim 1, wherein the core includes a ferrous material.

8. The magnetic device of claim 1, the core comprises a first portion and a second portion, wherein the first and second portions are affixed to one another.

9. The magnetic device of claim 1, wherein the core has at least one substantially flat surface adapted for engagement by a surface mounting apparatus.

10. The magnetic device of claim 9, wherein the core has two opposing substantially flat surfaces.

11. The magnetic device of claim 1, wherein a central portion of the core is positioned within the wound portion.

12. The magnetic device of claim 1, wherein the core has side apertures along outer side edges of the core, the side apertures having the first end of the winding projecting therethrough and the second end of the winding projecting therethrough on an opposite side of the wound portion.

13. The magnetic device of claim 1, wherein the magnetic device is reflow soldered to the circuit board.

14. The magnetic device of claim 1, wherein the core is an RM-shaped ferrite core.

* * * * *